(12) United States Patent
Miller

(10) Patent No.: US 6,930,888 B2
(45) Date of Patent: Aug. 16, 2005

(54) MECHANISM TO CROSS HIGH-SPEED DIFFERENTIAL PAIRS

(75) Inventor: Dennis J. Miller, Sherwood, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/288,346

(22) Filed: Nov. 4, 2002

(65) Prior Publication Data
US 2004/0084212 A1 May 6, 2004

(51) Int. Cl.[7] .................................................. H05K 1/18
(52) U.S. Cl. .................... 361/772; 361/778; 174/261; 333/4
(58) Field of Search .................. 361/764, 772, 361/774, 777, 778, 788; 174/261–264; 439/75, 78, 931; 333/1, 4, 5, 236, 238, 246, 33, 34, 12, 247, 260

(56) References Cited

U.S. PATENT DOCUMENTS

| | | | |
|---|---|---|---|
| 3,761,842 A | * | 9/1973 | Gandrud .................... 333/1 |
| 5,047,895 A | * | 9/1991 | Sasaki ...................... 361/749 |
| 5,357,051 A | | 10/1994 | Hwang |
| 5,432,485 A | | 7/1995 | Nagashima |
| 5,459,284 A | * | 10/1995 | Bockelman et al. ......... 174/34 |
| 5,646,368 A | | 7/1997 | Muyshondt et al. |
| 5,717,556 A | * | 2/1998 | Yanagida ................... 361/803 |
| 6,057,512 A | * | 5/2000 | Noda et al. ................ 174/250 |
| 6,396,000 B1 | * | 5/2002 | Baum ........................ 174/261 |
| 6,445,204 B1 | * | 9/2002 | He et al. ................... 324/763 |
| 6,514,090 B1 | * | 2/2003 | Neal et al. .................. 439/75 |

FOREIGN PATENT DOCUMENTS

DE            29923524       11/2000

* cited by examiner

Primary Examiner—Kamand Cuneo
Assistant Examiner—Thanh S. Phan
(74) Attorney, Agent, or Firm—Rob D. Anderson

(57) ABSTRACT

According to one embodiment, a printed circuit board (PCB) is disclosed. The PCB includes a first functional unit block (FUB) and differential traces coupled to the first FUB. The first FUB transmits high-speed serial data. The differential traces carry the high-speed serial data from the first FUB. In addition, the differential traces crossover on the same layer of the PCB while maintaining a constant impedance.

57 Claims, 2 Drawing Sheets

US 6,930,888 B2

MECHANISM TO CROSS HIGH-SPEED DIFFERENTIAL PAIRS

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention relates to printed circuit boards (PCBs); more particularly, the present invention relates to routing differential pairs on a PCB.

BACKGROUND

Recently, there has been a trend among hardware designers to implement serial interfaces between hardware components. Serial interfaces are high-speed point-to-point interfaces between box-to-box, board-to-board, or chip-to-chip interfaces. Serial interfaces reduce interconnect complexity, wires and space compared to parallel interfaces. Serial interfaces operate according to a differential mode wherein differential mode signals propagate through a pair of traces. One trace carries a conventional signal, while the other trace carries a signal that is exactly equal and opposite.

Often, the layout of the pin assignments of the interfaced components calls for the traces to be switched at the receiving component. Typically, the traces are crossed over on another layer of the printed circuit board (PCB) in order to maintain impedance matching between the traces. However, swapping the traces on different PCB layers increases the costs of manufacturing a PCB having integrated circuits and differential traces.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A method for crossing high-speed differential pairs is described. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
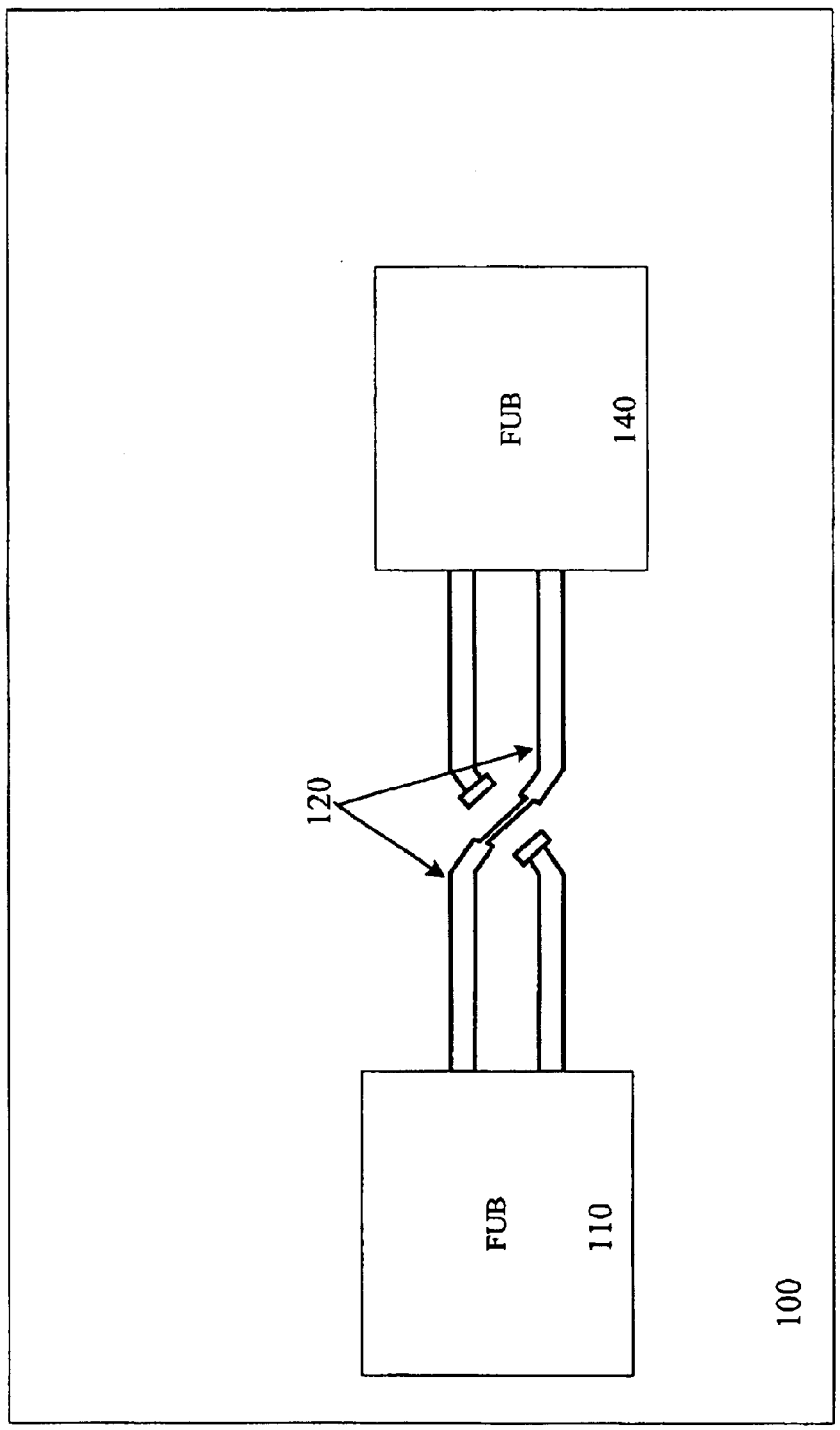
FIG. 1 illustrates one embodiment of a printed circuit board.

FIG. 1 illustrates one embodiment of a printed circuit board (PCB) 100. PCB 100 is a thin plate on which integrated circuits and other electronic components are located. PCB 100 includes functional unit block (FUB) 110, differential traces 120, and FUB 140.

In one embodiment, FUB 110 is an integrated circuit chip that includes logic circuitry that may encompass various components (e.g., microprocessor logic, micro-controller logic, memory logic, etc.). In a further embodiment, FUB 110 transmits high-speed (e.g., microwave) serial data. FUB 110 transmits the serial data and the complement of the data to FUB 140 via differential traces 120. In one embodiment, FUB 110 serializes the data prior to transmission. However, in other embodiments, the data may be serialized prior to being received at FUB 110.

Traces 120 are coupled to FUB 110. In one embodiment, traces 120 are complementary traces that transmit differential mode signals. One trace 120 carries a typical high-speed signal, while the other trace 120 carries a signal that is exactly equal and opposite. FUB 140 is coupled to traces 120. FUB 140 is also an integrated circuit chip that includes logic circuitry that may encompass various components.

In one embodiment, FUB 140 receives high-speed serial data. FUB 140 receives the serial data and the complement of the data from FUB 110 via complementary traces 120. In a further embodiment, FUB 140 de-serializes the data after receiving the data. However, in other embodiments, the data may be de-serialized after being transmitted from FUB 140.

In some instances, the layout of the pin assignments on FUB 110 and FUB 140 may necessitate that traces 120 be switched at the FUB 140 connection. Typically, complementary traces are designed in such a way that the characteristic impedance of the traces is constant everywhere along the trace. In laying out the differential pairs, the traces should be identical. Accordingly, the traces should have identical impedance and should be of identical length.

During crossover of the traces to accommodate pin assignments, one trace is typically crossed over on another layer of the PCB in order to maintain impedance matching between the traces. After the crossover, the trace is brought back to the same level and is connected to a FUB or connector.

According to one embodiment, traces 120 are designed to crossover on the same layer of PCB 100 while maintaining a constant impedance.

Figure 2:
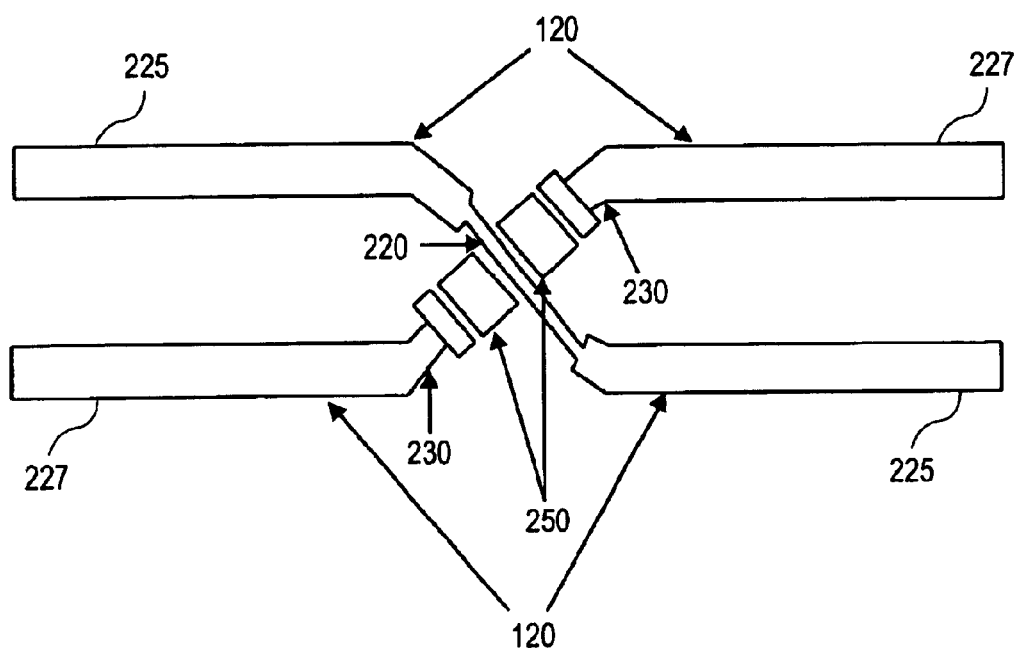
FIG. 2 illustrates one embodiment of differential traces.

FIG. 2 illustrates one embodiment of differential traces 120. Traces 120 include a passing trace 225 and a non-passing trace 227. Passing trace 225 includes a crossover section 220, while non-passing trace 227 includes narrow widths 230. In addition, a component 250 is coupled between the passing trace 225 and the non-passing trace 227. In one embodiment, component 250 is a passive component such as capacitor. Also, other passive components, such as a resistor, may be implemented as component 250.

According to one embodiment, the cross over section 220 of the passing trace 225 crosses the non-passing trace 227 at a right angle to component 250 in order to minimize cross talk. In addition, the narrow widths 230 of the non-passing trace 227 compensate for the higher dielectric constant provided by component 250. As a result a constant impedance is maintained as the traces 120 are crossed over.

The present invention enables the swapping of positions of the two halves of a differential pair without having to use vias to route signals to another layer of a PCB in order to maintain the proper impedance. Thus, very high frequency surface traces may be crossed without significant signal degradation.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A printed circuit board (PCB) comprising:
   a first functional unit block (FUB) that transmits high-speed serial data; and
   differential traces, coupled to the first FUB, that carry the high-speed serial data from the first FUB, a first of the differential traces crossing through a second of the differential traces in a non-continuous area of the second differential trace within a same layer of the PCB while maintaining a constant impedance.

2. The PCB of claim 1 further comprising a second FUB coupled to the differential traces, wherein the second FUB receives the high-speed serial data from the differential traces.

3. The PCB of claim 1 wherein the first differential trace is a passing trace and the second differential trace is a non-passing trace.

4. The PCB of claim 3 wherein the passing trace crosses the non-passing trace at a right angle.

5. The PCB of claim 3 further comprising:
   a component coupled between the passing trace and the non-passing trace.

6. The PCB of claim 5 wherein the component is a resistor.

7. The PCB of claim 5 wherein the component is a capacitor.

8. The PCB of claim 5 wherein the non-passing trace has a narrow section that compensates for the dielectric constant of passive components.

9. The PCB of claim 5, the non-passing trace further comprising a narrow width that compensates for a dielectric constant of the component in order to maintain the constant impedance.

10. The PCB of claim 5, the non-passing trace further comprising a narrow width that compensates for a dielectric constant of the component in order to maintain the constant impedance.

11. The PCB of claim 3, further comprising a narrow width of the non-passing trace.

12. The PCB of claim 11, wherein the narrow width helps to maintain the constant impedance.

13. The PCB of claim 1, wherein the first trace is a continuous physical trace and the second trace is physically non-continuous, the first trace passing through the second trace in a non-continuous portion thereof.

14. The PCB of claim 13, further comprising a component coupled between the first trace and the second trace in the non-continuous portion of the second trace.

15. The PCB of claim 1, wherein at least one of the differential traces includes a narrow width.

16. The PCB of claim 15, wherein the narrow width helps to maintain the constant impedance.

17. The PCB of claim 1, further comprising a component coupled between the differential traces.

18. The PCB of claim 17, wherein the component is a passive component.

19. A printed circuit board (PCB) comprising differential traces that carry high-speed serial data from a first logic element within a same layer of the PCB to a second logic element while maintaining a constant impedance, a first of the differential traces crossing through a second of the differential traces in a non-continuous area of the second differential trace.

20. The PCB of claim 19 wherein the first differential trace is a passing trace and the second differential trace is a non-passing trace.

21. The PCB of claim 20 wherein the passing trace crosses the non-passing trace at a right angle.

22. The PCB of claim 20 further comprising a component coupled between the passing trace and the non-passing trace.

23. The PCB of claim 22 wherein the component is a resistor.

24. The PCB of claim 22 wherein the component is a capacitor.

25. The PCB of claim 22 wherein the non-passing trace has a narrow section that compensates for the dielectric constant of passive components.

26. The PCB of claim 22, the non-passing trace further comprising a narrow width that compensates for a dielectric constant of the component in order to maintain the constant impedance.

27. The PCB of claim 20, further comprising a narrow width of the non-passing trace.

28. The PCB of claim 27, wherein the narrow width helps to maintain the constant impedance.

29. The PCB of claim 19, wherein the first trace is a continuous physical trace and the second trace is physically non-continuous, the first trace passing through the second trace in a non-continuous portion thereof.

30. The PCB of claim 29, further comprising a component coupled between the first trace and the second trace in the non-continuous portion of the second trace.

31. The PCB of claim 19, wherein at least one of the differential traces includes a narrow width.

32. The PCB of claim 31, wherein the narrow width helps to maintain the constant impedance.

33. The PCB of claim 19, further comprising a component coupled between the differential traces.

34. The PCB of claim 33, wherein the component is a passive component.

35. A printed circuit board (PCB) comprising:
    a first integrated circuit (IC) that transmits high-speed serial data; and
    differential traces, coupled to the first IC, to carry the high-speed serial data from the first IC, a first of the differential traces crossing through a second of the differential traces in a non-continuous area of the second differential trace within a same layer of the PCB while maintaining a constant impedance; and
    a second IC coupled to the differential traces to receive the high-speed serial data from the differential traces.

36. The PCB of claim 35 wherein the first trace is a passing trace and the second trace is a non-passing trace.

37. The PCB of claim 36 wherein the passing trace crosses the non-passing trace at a right angle.

38. The PCB of claim 36, further comprising a narrow width of the non-passing trace.

39. The PCB of claim 38, wherein the narrow width helps to maintain the constant impedance.

40. The PCB of claim 35, wherein the first trace is a continuous physical trace and the second trace is physically non-continuous, the first trace passing through the second trace in a non-continuous portion thereof.

41. The PCB of claim 40, further comprising a component coupled between the first trace and the second trace in the non-continuous portion of the second trace.

42. The PCB of claim 35, wherein at least one of the differential traces includes a narrow width.

43. The PCB of claim 42, wherein the narrow width helps to maintain the constant impedance.

44. The PCB of claim 35, further comprising a component coupled between the differential traces.

45. The PCB of claim 44, wherein the component is a passive component.

46. A printed circuit board (PCB) comprising:

differential traces that carry high-speed serial data, a first of the differential traces crossing through a second of the differential traces in a non-continuous area of the second differential trace within a same layer of the PCB while maintaining a constant impedance.

47. The PCB of claim 46 wherein the first trace crosses the second trace at a right angle.

48. The PCB of claim 46 further comprising:

a component coupled between the first trace and the second trace.

49. The PCB of claim 48 wherein the component is a passive component.

50. The PCB of claim 49 wherein the passive component is a resistor.

51. The PCB of claim 49 wherein the passive component is a capacitor.

52. The PCB of claim 49 wherein the second trace has a narrow section that compensates for the dielectric constant of the passive component.

53. The PCB of claim 48, the second trace further comprising a narrow width that compensates for a dielectric constant of the component in order to maintain the constant impedance.

54. The PCB of claim 46, wherein the first trace is a continuous physical trace and the second trace is physically non-continuous, the first trace passing through the second trace in a non-continuous portion thereof.

55. The PCB of claim 54, further comprising a component coupled between the first trace and the second trace in the non-continuous portion of the second trace.

56. The PCB of claim 46, herein at least one of the differential traces includes a narrow width.

57. The PCB of claim 56, wherein the narrow width helps to maintain the constant impedance.

* * * * *